United States Patent
Ng

(10) Patent No.: US 7,109,427 B1
(45) Date of Patent: Sep. 19, 2006

(54) TWO STAGE MOLDED MEMORY CARDS

(76) Inventor: Chor-Ming Ng, Flat F, 5th Floor, Block 8, Classical Garden Phase 2, Tai Po, Hong Kong (CN)

( * ) Notice: Subject to any disclaimer, the term of this patent is extended or adjusted under 35 U.S.C. 154(b) by 0 days.

(21) Appl. No.: 11/273,375

(22) Filed: Nov. 14, 2005

(51) Int. Cl.
*H01L 23/28* (2006.01)

(52) U.S. Cl. .................. 174/521; 361/737; 29/841

(58) Field of Classification Search .............. 29/841, 29/846; 174/521; 361/737
See application file for complete search history.

(56) References Cited

U.S. PATENT DOCUMENTS

| | | | | |
|---|---|---|---|---|
| 6,483,038 B1 * | 11/2002 | Lee et al. | .................... | 174/255 |
| 6,486,536 B1 * | 11/2002 | Chye et al. | ................. | 257/667 |
| 6,539,623 B1 * | 4/2003 | Chen | ........................... | 29/841 |
| 7,030,316 B1 * | 4/2006 | Centofante | .................... | 29/841 |

* cited by examiner

*Primary Examiner*—Hung V. Ngo
(74) *Attorney, Agent, or Firm*—Charles C. Logan, II

(57) ABSTRACT

A method for producing a finished multimedia card (MMC) in a single molding operation in a second stage manufacturing operation. The first stage involves obtaining an already molded top plate and an already assembled printed circuit board (PCB). The second stage involves placing the molded top plate and assembled printed circuit board together in a mold assembly and then placing the mold assembly in an injection molding machine. The printed circuit board is thus only exposed to a single molding operation in order to produce a finished multimedia card such as a memory card. The single molding operation produces an improved quality multimedia card.

16 Claims, 2 Drawing Sheets

TWO STAGE MOLDED MEMORY CARDS

BACKGROUND OF THE INVENTION

1. Field of the Invention

The invention relates generally to semiconductor manufacturing. More particularly, the invention pertains to an improved method of fabricating multimedia cards (MMC).

2. State of the Art

One type of electronic assembly containing semiconductor components is generally referred to as "card". Examples of such "cards" include multimedia cards (MMC) such as used in digital cameras and the like, memory cards, smart cards and personal computer memory card international association (PCMCIA) cards. In the industry, these types of cards are sometimes referred to collectively as "semiconductor cards," "multimedia cards" or "daughter boards."

One of the conventional methods of making multimedia cards (MMC) takes an assembled circuit board and places a protective cover sheet over the top surface of the printed PCB. A plastic top cover is positioned over the protective cover sheet and a plastic bottom plate member is positioned beneath the PCB member. The four stacked members are assembled together as a completed multimedia card. The advantages to this process is that the assembly process is simple, no special technique is required and the assembled PCB can be salvaged. One disadvantage to this process is that there is a requirement for separate top and bottom plastic case members. The thickness of the top and bottom case members is limited due to the overall height limitation for the multimedia cards. An additional disadvantage is that there is no sealing of the components on the printed circuit board and moisture may cause component failure.

A second conventional method for assembling a multimedia card requires five separate components. These components are stacked from top to bottom include a metal sheet cover, a first thermo-bond film, a plastic frame, a second thermo-bond film and an assembled PCB. The most important advantage to this process is that it involves a straight forward design. The advantages of the process is that the process is complicated, the bonding process is difficult to control and there is a high cost due to the number of components and processes. Also there is no sealing of the components and moisture may cause component failure. Lastly it is difficult to salvage the PCB. In the process just described, a central plastic frame provides structure for spacing the top metal sheet from the top surface of the PCB and prevents the PCB from being crushed during assembly.

It is an object of the invention to provide an improved method for manufacturing multimedia cards such as memory cards.

It is also an object of the invention to produce multimedia cards having superior construction.

It is another object of the invention to provide improved multimedia cards having a rugged construction in which all of the electrical components on the top surface of the PCB are all sealed and protected from dust, water, weather and are shock proof.

It is also an object of the invention to provide a more economical method for manufacturing multimedia cards.

It is an additional object of the invention to provide an improved method for manufacturing multimedia cards which allows damage to the PCB to be minimized.

SUMMARY OF THE INVENTION

The method for forming a multimedia card is referred to as a two stage molding method. The first stage molding is mainly to form the top plate member of the memory card assembly. This top plate member is also the main structural component for providing the required rigidity for the card. The top plate member is produced in a high speed injection molding machine. It has a thin wall structure with downwardly extending ribs and post members from its bottom surface to allow sufficient space for the height of the electronic components on the top surface of the PCB. These rib members and post members protect the PCB electronic components during what will be described as the second stage molding.

The assembled PCB has a thin substrate having a top surface and a bottom surface. Mounted on the top surface of the substrate is a thin small outline package (TSOP) and a flash controller. A plurality of electrical contacts are integrally formed in the bottom surface of the substrate.

The second stage molding is mainly to overmold together the top plate member of the first stage molding and also the PCB, to complete the form factor and produce the final dimensions of the memory card. The top plate member and the assembled PCB are placed into the mold assembly and plastic resins are melted in the plasticising system of an injection molding machine, and then injected in the closed mold halves by the injection system. The molten resins are pushed into the mold and fill up all of the spaces in between the top plate member and the PCB. The molten resins are held under pressure while cooling to prevent shrinkage. When the resin is cooled and becomes solidified the mold halves are opened and the product is ejected from one of the mold halves.

In using this two stage molding method, all voids and vacant chambers in between the bottom surface of the top plate member and the PCB are filled and sealed by plastic. Also the top plate member and the PCB are held together by the adhesion effect of the resin to avoid any separation of the two members. The final product is a rigid, solid and durable piece of assembly. Dust and moisture are unable to contact the inside components. Also the anti-shock characteristics of the final assembly is higher as compared to conventional shell type of assembly. All of the components of the PCB are closely encapsulated by plastic in addition to the solder joints, compared to those of the prior art assembled shell type structure where only the soldered hold the components to the PCB substrate. The memory card manufactured by this two stage molding method is dust, water, weather and shockproof.

After the injection molding process has been completed, the mold is opened after the resin has cooled and become solidified. The memory card is then ejected from one of the mold halves the last step is to remove the runner from the completed memory card.

DESCRIPTION OF THE PREFERRED EMBODIMENT

Figure 1:
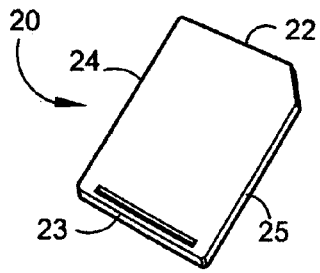
FIG. 1 is a rear perspective view of the novel memory card.
Figure 2:
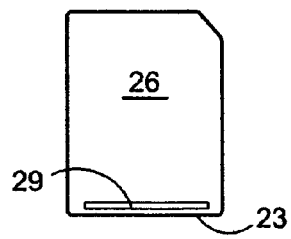
FIG. 2 is a top plan view of the memory card.
Figure 3:
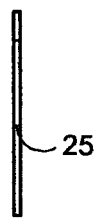
FIG. 3 is a right side elevation view of the memory card.
Figure 4:
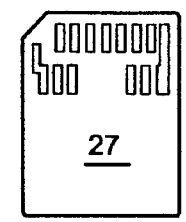
FIG. 4 is a bottom plan view of the memory card.

The multimedia card (MMC) will now be described by referring to FIGS. 1–10 of the drawings. The example of the MMC discussed will be a memory card. It is to be understood that various types of multimedia cards can have a structure similar to that of a memory card.

The memory card is designated numeral 20 and in FIGS. 1–4 it is illustrated in substantially its actual size. It has a front end or insertion end 22, a rear end or non insertable end 23, a left side edge 24, a right side edge 25, a top surface 26 and a bottom surface 27. A fingernail gripping groove 29 is formed in top surface 26 adjacent non insertable end 23.

Figure 5:
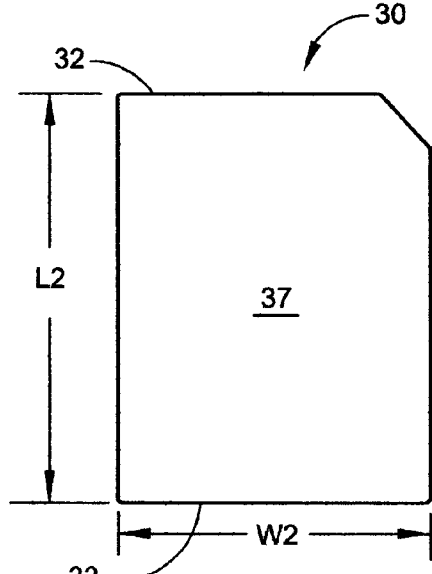
FIG. 5 is an enlarged top plan view of the top plate member.
Figure 6:
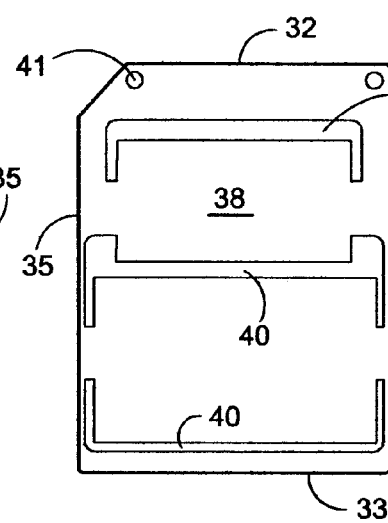
FIG. 6 is an enlarged bottom plan view of the top plate member.
Figure 7:
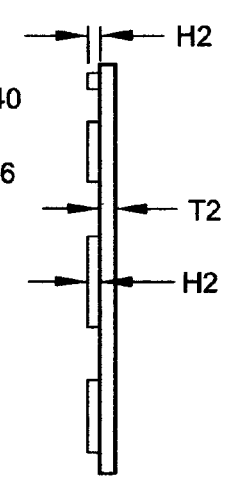
FIG. 7 is an enlarged left side elevation view of the top plate member.

Top plate member 30 is showing in enlarged dimensions in FIGS. 5–7. Top plate member 30 has a front end 32, a rear end 33, a left edge 36, a right edge 35, a planar top surface 37 and a bottom surface 38. Top plate member 30 has a width W2, a length L2 and a thickness T2 that is approximately 0.018 inches. Extending downwardly from the bottom surface 38 are a plurality of distinctly configured ribs 40 and a pair of posts members 41. These ribs members and post members have a height H2 and have been integrally formed on bottom surface 38 of the top plate members 40 in a previous injection molding operation.

Figure 8:
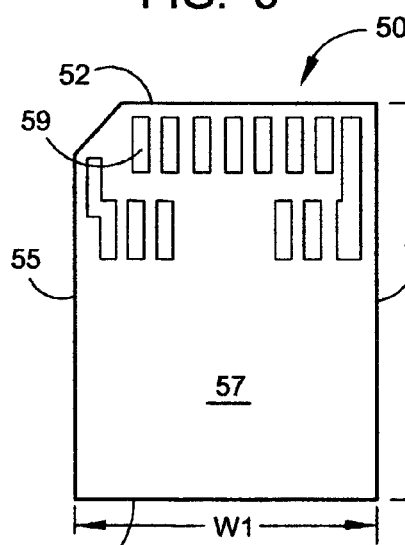
FIG. 8 is an enlarged bottom plan view of the printed circuit board member.
Figure 9:
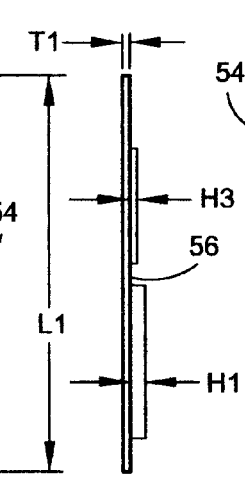
FIG. 9 is an enlarged left side elevation view of the printed circuit board member.
Figure 10:
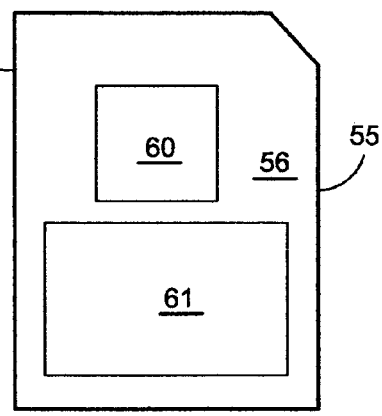
FIG. 10 is an enlarged top plan view of the printed circuit board member.

Printed circuit board member 50 is shown in enlarged dimensions in FIGS. 8–10. Printed circuit board member 50 has a front end 52, a rear end 53, a left side edge 54 a right side edge 55, a top surface 56, a bottom surface 57 and a thickness T1 that is approximately 0.010 inches. A plurality of electrical contacts 59 are integrally formed in bottom surface 57. Various electrical components have been secured to the top surface 56 of printed circuit board member 50 in a previous assembly operation. Electrical component 61 is a flash controller. Electrical components 60 and 61 extend above top surface 56 and the highest of these electrical components has a height H1. Flash controller 61 has a height H3.

The configuration of the spaced ribs' 40 is such that they surround the electrical components 60 and 61 when the top plate member and PCB are stacked upon each other in a mold assembly. The height H2 of the ribs' 40 is at least equal to the height H1 of the highest electrical component so that the electrical components are not compressed or damaged during the molding operation in the mold assembly. The ribs 40 and post 41 give substantial additional structural strength to top plate member 30. The width W1 and length L1 of the printed circuit board number 50 is slightly less than the width W2 and the length L2 of top plate member 30. The reason for this is that when a plastic resin is injected into the mold assembly and it flows between top plate member 30 and printed circuit board member 50, the plastic resin will also form the peripheral edges of the fully assembled memory card 20. During the molding process, all of the voids and vacant chambers in between top plate member 30 and printed circuit board member 50 are all filled and sealed by the plastic resin. Top plate member 30 and printed circuit board member 50 are held together by the adhesion effect of the resin and keep them from separating. The final product is a rigid, solid and durable assembly. Dust and moisture are unable to contact the interior electrical components. The anti-shock characteristics of the final assembly are higher than that of prior art MMC's produced by previous shell type assembly. All of the electrical components are closely encapsulated by the plastic resin.

Figure 11:
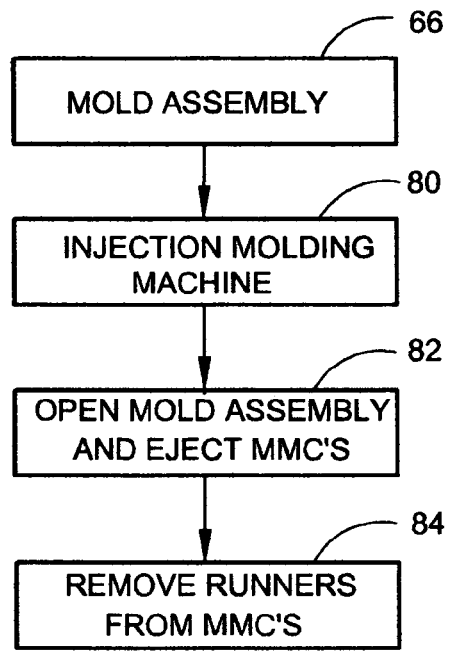
FIG. 11 is a flow diagram showing the manufacturing process for the memory card.
Figure 12:
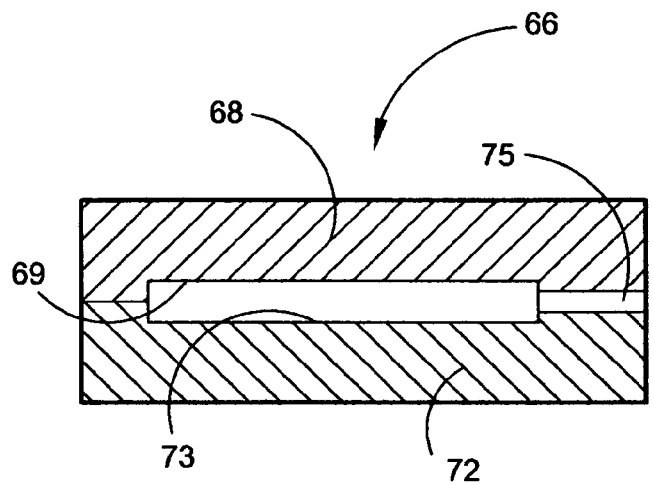
FIG. 12 is an enlarged schematic vertical cross sectional view of the mold assembly shown in FIG. 11.
Figure 13:
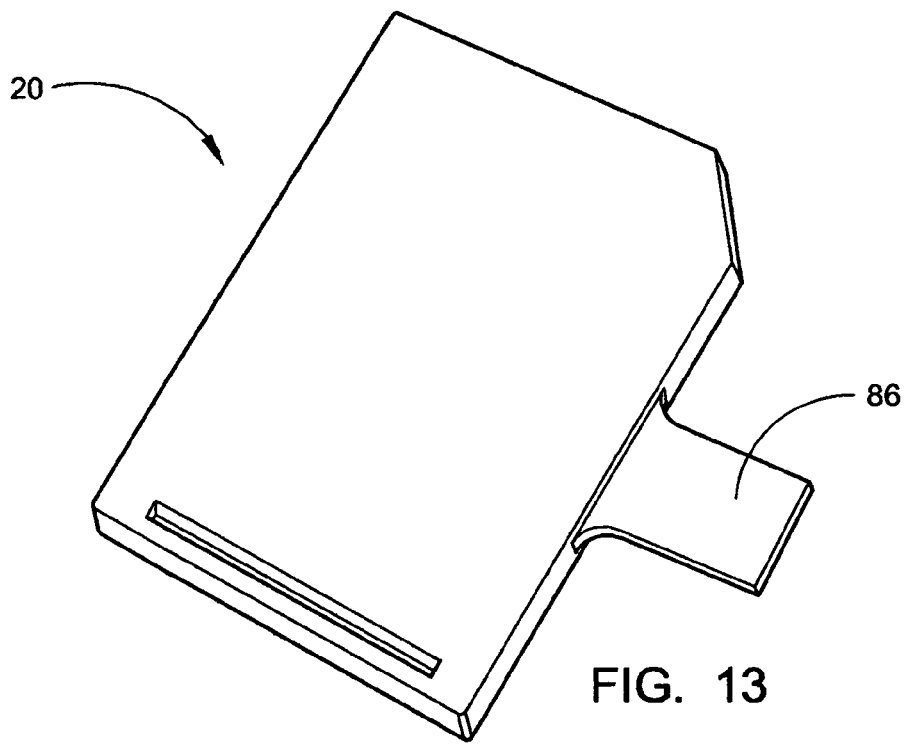
FIG. 13 is an enlarged rear perspective view showing the memory card after it has been ejected from the mold assembly identified above in FIGS. 11 and 12.

The method for assembling the top plate member 30 to the printed circuit board member 50 is illustrated in FIGS. 11–13. Mold assembly 66 has a top mold plate 68 having a top plate cavity 69 in its bottom surface. Bottom mold plate 72 has a PCB cavity 73 formed in its top surface. A runner cavity 75 extends from the respective cavities 69 and 73 to the outer edge of mold assembly 66.

Prior to the injection molding operation preceding, a top plate member 30 is inserted in top plate cavity 69 and a printed circuit board member 50 is inserted into the PCB cavity 73. Next the mold assembly 66 is positioned in the injection molding machine 80 and a plastic resin is delivered into the mold assembly to fill up all of the spaces in between top plate member 30 and printed circuit board member 50. The molten resin is held under pressure while cooling to prevent shrinkage.

The next operation is identified in the flow chart as 82 and when the resin is cooled and becomes solidified, the mold halves are opened and the product is ejected from one of the mold halves. The ejected product is shown in FIG. 13. The next process is identified by numeral 84 on the flow chart. This last step is to remove the runner 86 from the completed memory card 20.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and the number and configuration of various components described above may be altered, all without departing from the spirit or scope of the invention as defined in the appended Claims.

What is claimed is:

1. A method for producing a finished multimedia card (MMC) in a single molding operation, comprising the steps of:

a) providing an already assembled printed circuit board (PCB) having a substrate having a top surface, a bottom surface, a front edge, a rear edge, a left side edge, a right side edge, a thickness T1, a width W1 and a length L1; said PCB having electronic components secured on said top surface of said substrate; the greatest height of any of said electronic components above said top surface of said substrate being H1;

b) providing an already molded top plate having a top surface, a bottom surface, a front edge, a rear edge, a left side edge, a right side edge, a thickness T2, a width W2 and a length L2; spacer means extending downwardly from a plurality of locations on said bottom surface of said top plate; said spacer means being integrally formed on said bottom surface of said top plate;

c) providing a mold assembly having a top mold plate and a bottom mold plate; said top mold plate having a bottom surface having at least one top plate cavity therein; said bottom mold plate having at least one PCB cavity therein;

d) placing one or more top plates in said respective top plate cavities; placing one or more already assembled PCB's in said respective PCB cavities;

e) injecting plastic resin into said assembled mold plates to fill the space between said bottom surface of said molded top plates and said top surface of said already assembled PCB's; and f) opening said mold assembly and ejecting the MMC.'s.

2. The method of claim 1, further comprising the step of:

g) removing runners from said MMC's.

3. The method of claim 1 wherein said MMC. is a memory card.

4. The method of claim 1 wherein said molded top plate has a transversely extending groove on said top surface of said molded top plate adjacent said front end for ensuring easy retrieval of said MMC. from the receiving slot of an apparatus by a person's fingernail.

5. The method of claim 1 wherein said already assembled PCB has external contacts on said bottom surface of said PCB.

6. The method of claim 5 wherein said external contacts are located adjacent said front end of said bottom surface of said PCB.

7. The method of claim 1 wherein said width W1 and said length L1 of said already assembled PCB are both smaller than said respective width W2 and length L2 of said already molded top plate so that a peripheral edge is molded on said finished MMC.

8. The method of claim 1 wherein the thickness T2 of said top plate is greater than the thickness T1 of said PCB and the material of said top plate is stronger than the material of said substrate of said PCB and these structural features provide the strength of said finished MMC.

9. The method of claim 1 wherein one of said electronic components mounted on said substrate of said PCB is a flash controller.

10. The method of claim 1 wherein said top surface of said top plate is planar.

11. The method of claim 1 wherein at least some of said spacer means on said bottom surface of said top plate are elongated ribs that increase the structural strength of said top plate and ultimately said finish molded MMC.

12. The method of claim 1 wherein at least some of said spacer means on said bottom surface of said top plate are post members that increase the structural strength of said top plate and ultimately said finish molded MMC.

13. The method of claim 1 wherein the sum of the thicknesses T1, H2 and T2 is within the industry standard set by PCMCIA.

14. The method of claim 1 wherein L2 is less than 2 inches and W1 is less than 2 inches.

15. The method of claim 1 wherein said molded top plate is made of plastic material.

16. A multimedia card produced in accordance with the method of claim 1.

* * * * *